United States Patent [19]

Barker

[11] 4,410,953
[45] Oct. 18, 1983

[54] ANGLE COMPARISON DEVICE

[75] Inventor: Horace A. Barker, Dorridge, England

[73] Assignee: ASR Servotron AG, Petit-Lancy, Switzerland

[21] Appl. No.: 217,124

[22] Filed: Dec. 17, 1980

Related U.S. Application Data

[63] Continuation of Ser. No. 41,438, May 22, 1979, abandoned.

[51] Int. Cl.³ ............................ G06J 1/00; G06G 7/22
[52] U.S. Cl. ............................ 364/603; 340/347 DA; 364/606; 364/815
[58] Field of Search ............... 364/603, 606, 815, 817; 340/347 SY, 347 DA

[56] References Cited

U.S. PATENT DOCUMENTS

| 3,558,863 | 1/1971 | Williams, Jr. et al. | 364/603 |
| 3,868,680 | 2/1975 | Rhodes | 364/603 X |
| 3,974,367 | 8/1976 | Mayer | 364/603 |
| 4,090,244 | 5/1978 | Altwein | 364/603 |
| 4,138,729 | 2/1979 | Bayer et al. | 364/603 |

FOREIGN PATENT DOCUMENTS 1354350  5/1974  United Kingdom ............... 364/603

Primary Examiner—Joseph F. Ruggiero
Attorney, Agent, or Firm—Stevens, Davis, Miller & Mosher

[57] ABSTRACT

Apparatus for providing an analogue output which is a trigonometrical function of the sum of an analogue angle input $\theta$ and a digital angle input $\phi$ comprises multiplying means for multiplying sines and cosines of the two angles to produce signals representing $\sin\theta \cos\theta$ and $\sin\phi \cos\theta$ and/or $\cos\theta \cos\phi$ and $\sin\theta \sin\phi$.

5 Claims, 1 Drawing Figure

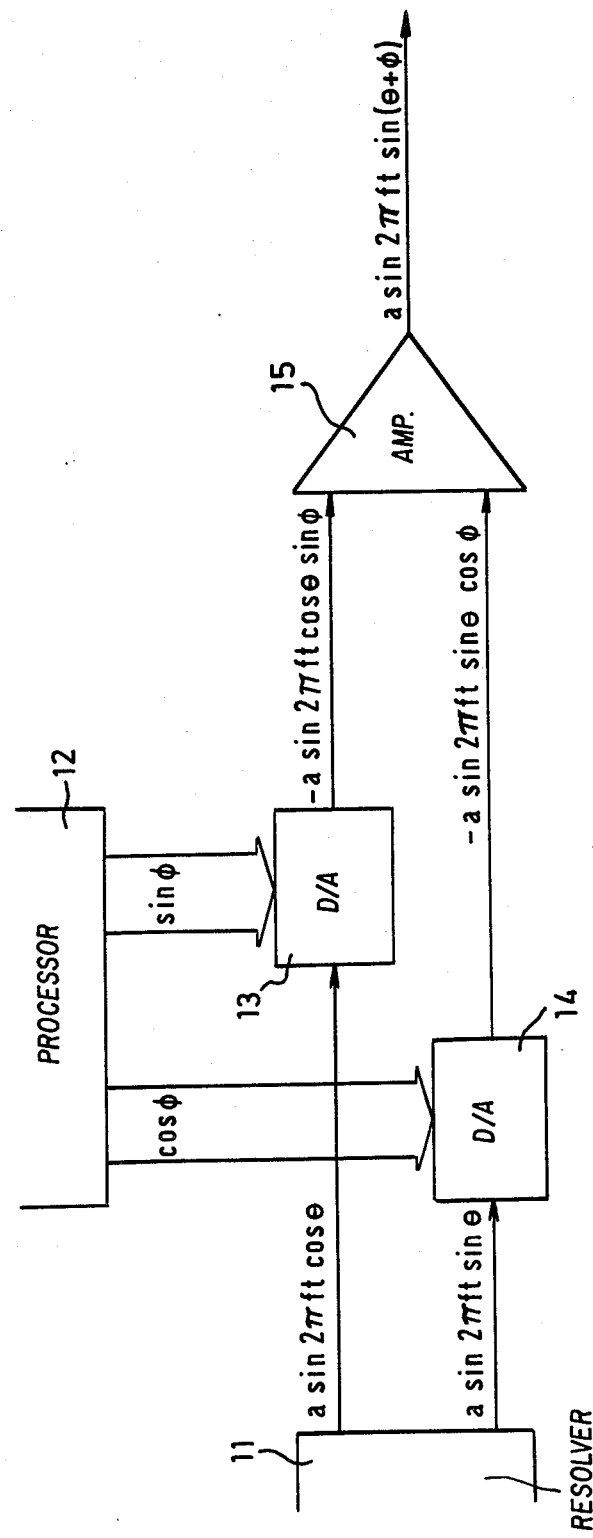

ANGLE COMPARISON DEVICE

This is a continuation of application Ser. No. 41,438 filed May 22, 1979, abandoned.

This invention relates to apparatus for providing an analogue output which is a trigonometrical function of the sum of an analogue angle input and a digital angle input.

The analogue angle input $\theta$ is represented by two analogue signals proportional to the functions $\sin \theta$ and $\cos \theta$. The digital angle input $\phi$ is represented by two digital words which express the functions $\sin \phi$ and $\cos \phi$.

According to the invention there is provided apparatus for providing an analogue output which is a trigonometrical function of the sum of an analogue angle input and a digital angle input comprising digital/analog converter for multiplying sines and cosines of the two angles to produce signals representing $\sin \theta \cos \phi$ and $\sin \phi \cos \theta$ and/or signals representing $\cos \theta \cos \phi$ and $\sin \theta \sin \phi$.

The multiplying means preferably are provided by two digital/analogue converters, one responsive to the digital word expressing the function $\sin \phi$ and the other responsive to the digital word expressing the function $\cos \phi$. One converter is also responsive to the analogue signal proportional to the function $\sin \theta$ and the other to the analogue signal proportional to the function $\cos \theta$. The converters multiply the functions expressed by their inputs to produce analogue outputs which are fed to adding means whose output then represents the sine or cosine of the sum of the angles $\theta$ and $\phi$.

The analogue signal may be direct voltages or any convenient form of amplitude modulated signal, such as the suppressed carrier output of a resolver. The digital words may consist of any number of bits arranged in a convenient code, and preferably the words are provided in twelve-bit offset binary form from the output of a digital processor.

The generation of signals representing sine and cosine products is simpler than prior art devices which divide the trigonometric formula for the sine or cosine of the sum of two angles by the cosine of one of the angles in order to produce a tangent function of one of the angles. The preferable form of the multiplying means as a digital/analogue converter provides a convenient means for generating the products set out in the preceding paragraphs.

An example of the invention will now be described with reference to the accompanying block diagram.

The sole FIGURE is the application illustrates a block diagram of a resolver which provides an analog output comprising the trigonometrical function of the sum of an analog input and a digital angle input.

A resolver 11 provides supressed-carrier signals a $\sin 2\pi$ ft $\cos \theta$ and a $\sin 2\pi$ ft $\sin \theta$. A digital processor 12 provides 12-bit offset binary words which represent the nearest integer values to $2^{11} - (2^{11} - 1) \sin \phi$ and $2^{11} - (2^{11} - 1) \cos \phi$. The present example is intended to provide an analogue output representing the sine of the sum of the angles $\theta$ and $\phi$, and two multiplying digital/analogue converter units 13 and 14 are provided together with an operational amplifier 15 to add the analogue outputs of the converters.

The converter 13 receives the digital word associated with $\sin \phi$ and the analogue signal associated with $\cos \theta$ to produce a supressed-carrier signal—a $\sin 2\pi$ ft $\sin \theta$ cos $\phi$. The converter 14 similarly produces a supressed-carrier signal—a $\sin 2\pi$ ft $\cos \theta \sin \phi$. The output of the operational amplifier 15 is a supressed-carrier signal a$2\pi$ ft a $\sin 2\pi$ ft$(\sin \theta \cos \phi + \cos \theta \sin \phi)$, or in other words a $\sin 2\pi$ ft $\sin (\theta + \phi)$.

The digital/analogue converters and the operational amplifier may each comprise an integrated circuit, which provides simplicity and accuracy. The use of offset binary words of 12 bits each provides an overall accuracy of 1 part in $2^{11}$, and greater accuracy can be achieved using longer words. If proportional and angular errors are introduced with the analogue inputs, they may be compensated by means of corrections applied to the digital input functions $\sin \phi$ and $\cos \phi$.

If the analogue inputs are $(1+e_1) \sin (\theta + \Sigma_1)$ and $(1+e_2) \cos (\theta + \Sigma_2)$, then errors may be compensated by using the digital input functions $$\frac{\sin (\phi - \Sigma_1)}{(1 + e_2) \cos (\Sigma_2 - \Sigma_1)}$$

and $$\frac{\cos (\phi - \Sigma_2)}{(1 + e_1) \cos (\Sigma_2 - \Sigma_1)}.$$

When $\theta$ and $\phi$ are equal and opposite, the output of the illustrated apparatus will be zero, so that the apparatus acts as a hybrid angle comparator between the digital angle $\phi$ and analogue angle $\theta$.

It can be arranged that the signs of the input angles $\theta$ or $\phi$ are changed, or the signs of the input functions $\sin \theta$, $\cos \theta$, $\sin \phi$ or $\cos \phi$ are changed or the digital/analogue converter inputs are interchanged in any combination to obtain any of the functions $\pm \sin (\pm \theta \pm \phi)$ or $\pm \cos (\pm \theta \pm \phi)$. It can also be arranged that the inputs are the unipolar functions $|\sin \theta|$, $|\cos \theta|$, $|\sin \phi|$ or $|\cos \phi|$, with the required signs obtained by means of polarity reversing switches.

What I claim is:

1. Apparatus for providing an analogue output which is a trigonometrical function of the sum of an analogue angle amplitude modulated input represented by a $\sin 2\pi$ ft $\cos \theta$ and a $\sin 2\pi$ ft $\sin \theta$, and a digital angle input $\phi$, comprising a digital processor for producing said digital angle input $\phi$ comprising digital words representing the value of $\sin \phi$ and $\cos \phi$, said processor having a capability to modify said digital words to compensate for errors in said analogue input, said analogue input containing errors expressed as $(1+\epsilon_1) \sin (\theta + \Sigma_1)$ and $(1+\epsilon_2) \cos (\theta + \Sigma_2)$, said processor modifying the value represented by said digital words using the following digital input functions:

$$\frac{\sin (\phi - \Sigma_1)}{(1 + \epsilon_2) \cos (\Sigma_2 - \Sigma_1)}$$

and $$\frac{\cos (\phi - \Sigma_2)}{(1 + \epsilon_1) \cos (\Sigma_2 - \Sigma_1)},$$

two digital/analogue converters for multiplying sines and cosines of the two angles to produce signals —a $\sin 2\pi$ ft $\cos \theta \sin \phi$ and —a $\sin 2\pi$ ft $\sin \theta \cos \phi$, and means for combining signals produced by said converters whereby a signal a $\sin 2\pi$ ft $\sin (\theta + \phi)$ is produced.

2. Apparatus as claimed in claim 1 wherein said combining means comprises an operational amplifier for adding signals from the converters.

3. Apparatus as claimed in claim 1 further comprising a resolver to produce, when set at angle $\theta$, analogue signals representing $\sin \theta$ and $\cos \theta$.

4. Apparatus as claimed in claim 1, wherein said produced digital words are in offset binary form.

5. Apparatus as claimed in claim 1, wherein said produced digital words have at least 12 bits each.

* * * * *